United States Patent
Huang

(10) Patent No.: US 7,443,666 B2
(45) Date of Patent: Oct. 28, 2008

(54) MOUNTING APPARATUS FOR MOUNTING EXPANSION CARDS IN COMPUTER ENCLOSURE

(75) Inventor: Ri-Dong Huang, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 524 days.

(21) Appl. No.: 11/019,796

(22) Filed: Dec. 21, 2004

(65) Prior Publication Data
US 2006/0018101 A1 Jan. 26, 2006

(30) Foreign Application Priority Data
Jul. 21, 2004 (CN) .................. 2004 2 0071950 U

(51) Int. Cl.
H05K 5/00 (2006.01)
H05K 7/00 (2006.01)
G06F 1/16 (2006.01)
A47B 97/00 (2006.01)

(52) U.S. Cl. .................. 361/684; 361/683; 312/223.1; 312/223.2

(58) Field of Classification Search .......... 361/679, 361/682–686; 312/223.1, 223.2, 222
See application file for complete search history.

(56) References Cited

U.S. PATENT DOCUMENTS

| | | | |
|---|---|---|---|
| 4,745,524 A | 5/1988 | Patton, III | |
| 5,694,291 A * | 12/1997 | Feightner | 361/683 |
| 5,822,196 A | 10/1998 | Hastings et al. | |
| RE36,695 E | 5/2000 | Holt | |
| 6,069,796 A | 5/2000 | Hastings et al. | |
| 6,231,139 B1 * | 5/2001 | Chen | 312/223.2 |
| 6,278,614 B1 * | 8/2001 | Beaman et al. | 361/752 |
| 6,442,038 B1 * | 8/2002 | Erickson et al. | 361/759 |
| 6,480,393 B1 | 11/2002 | Chen | |
| 6,487,070 B2 * | 11/2002 | Gan | 361/683 |
| 6,549,398 B2 * | 4/2003 | Chen | 361/683 |
| 6,552,913 B2 | 4/2003 | Tournadre | |
| 6,608,765 B2 | 8/2003 | Vier et al. | |
| 6,674,650 B1 * | 1/2004 | Davis et al. | 361/796 |
| 6,704,205 B1 * | 3/2004 | Chen | 361/740 |
| 6,927,984 B2 * | 8/2005 | Chen | 361/801 |

(Continued)

Primary Examiner—Jayprakash Gandhi
Assistant Examiner—Anthony M Haughton
(74) Attorney, Agent, or Firm—Morris, Manning & Martin LLP; Tim Tingkang Xia

(57) ABSTRACT

A mounting apparatus for mounting expansion cards (30) with cover plates (35) to a computer enclosure includes a rear panel (14) and a fixing member (40). The cover plate has a bent portion (37). The rear panel has a card cage (25) which includes a bent wall (27). The rear panel defines an opening (16) therein. Two slices (18) extend from the rear panel at both sides of the opening. A first positioning means (22) is formed on the slice. The fixing member pivotably mounted to the rear panel and rotated through the opening includes a bottom wall (42), a rear wall (46) and two tabs (50) extending forwardly from both sides of the rear wall. A second positioning means (54) is formed on each of the tabs. A plurality of elastic pressing means (58) is formed on the bottom wall corresponding to the bent portions of the cover plates.

11 Claims, 5 Drawing Sheets

U.S. PATENT DOCUMENTS

2004/0037048 A1 2/2004 Liao
2004/0170007 A1* 9/2004 Chen .......................... 361/801
2005/0059285 A1* 3/2005 Chen et al. .................. 439/325

* cited by examiner

MOUNTING APPARATUS FOR MOUNTING EXPANSION CARDS IN COMPUTER ENCLOSURE

CROSS-REFERENCE TO RELATED APPLICATIONS

This application is related to U.S. patent application Ser. No. 10/940,246, entitled "EXPANSION CARD RETENSION APPARATUS", filed on Sep. 13, 2004 with the same assignee as the instant application. The disclosure of the above identified application is incorporated herein by reference.

BACKGROUND OF THE INVENTION

1. Field of the Invention

The present invention relates to a mounting apparatus for mounting expansion cards in a computer enclosure, and particularly to a mounting apparatus which readily secures a plurality of expansion cards in a computer enclosure and allows convenient removal of the expansion cards therefrom.

2. Description of the Related Art

In order to upgrade the operating capabilities of a personal computer, a plurality of expansion cards is operatively installed in the computer enclosure. Typical types of expansion cards include network cards, sound cards, graphics accelerator cards and multi-media cards, etc. These expansion cards may be installed in the computer enclosure during its original manufacture or by the computer purchaser.

U.S. Pat. No. 4,745,524 discloses a plurality of mounting systems for mounting a plurality of expansion cards inside a computer chassis. Each mounting system includes a pressing element and a screw to secure a separate cover plate of corresponding expansion card. However, installing screws one by one is time-consuming and cumbersome. Moreover, during installation/removal of the expansion cards, one or more of the screws can easily fall into the crowded interior of the computer, thereby creating a difficult retrieval.

Thus an improved mounting device which overcomes the above-mentioned problems is desired.

SUMMARY OF THE INVENTION

Accordingly, an object of the present invention is to provide a mounting apparatus which can readily and securely attach expansion cards in a computer enclosure.

To achieve the above-mentioned object, a mounting apparatus for mounting a plurality of expansion cards with cover plates to a computer enclosure comprises a rear panel and a fixing member. The cover plate has an elongated portion and a bent portion. The rear panel has a card cage which comprises a base wall to support the cover plates, and a bent wall. The rear panel defines an opening therein at an upper portion of the card cage. At least one slice extends from the rear panel at one side of the opening. A first positioning means is formed on said at least one slice. The fixing member pivotably mounted to the rear panel and rotated through the opening comprises a bottom wall, a rear wall extending upwardly from a rear side of the bottom wall, and at least one tab extending forwardly from one side of the rear wall. A second positioning means engaging with the first positioning means is formed on said at least one tab. A plurality of elastic pressing means pressing the bent portions of the expansion cards is formed on the bottom wall.

Other objects, advantages and novel features of the present invention will be drawn from the following detailed description of a preferred embodiment of the present invention with attached drawings, in which:

DETAILED DESCRIPTION OF THE INVENTION

Figure 1:
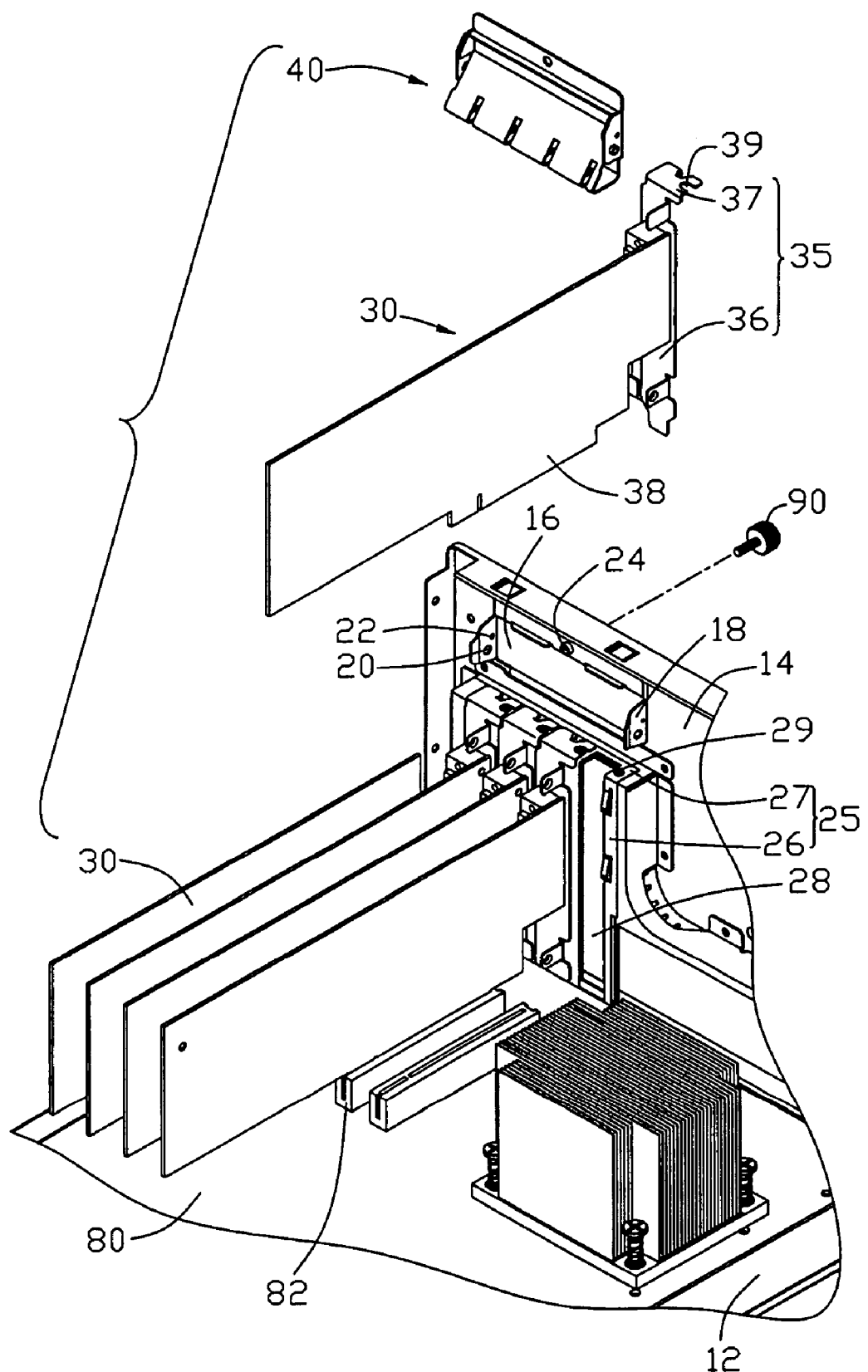
FIG. 1 is an exploded, isometric view of a mounting apparatus in accordance with the preferred embodiment of present invention, together with a circuit board, a plurality of expansion cards and a plurality of cover plates for expansion cards, the mounting apparatus comprising a chassis and a fixing member.
Figure 2:
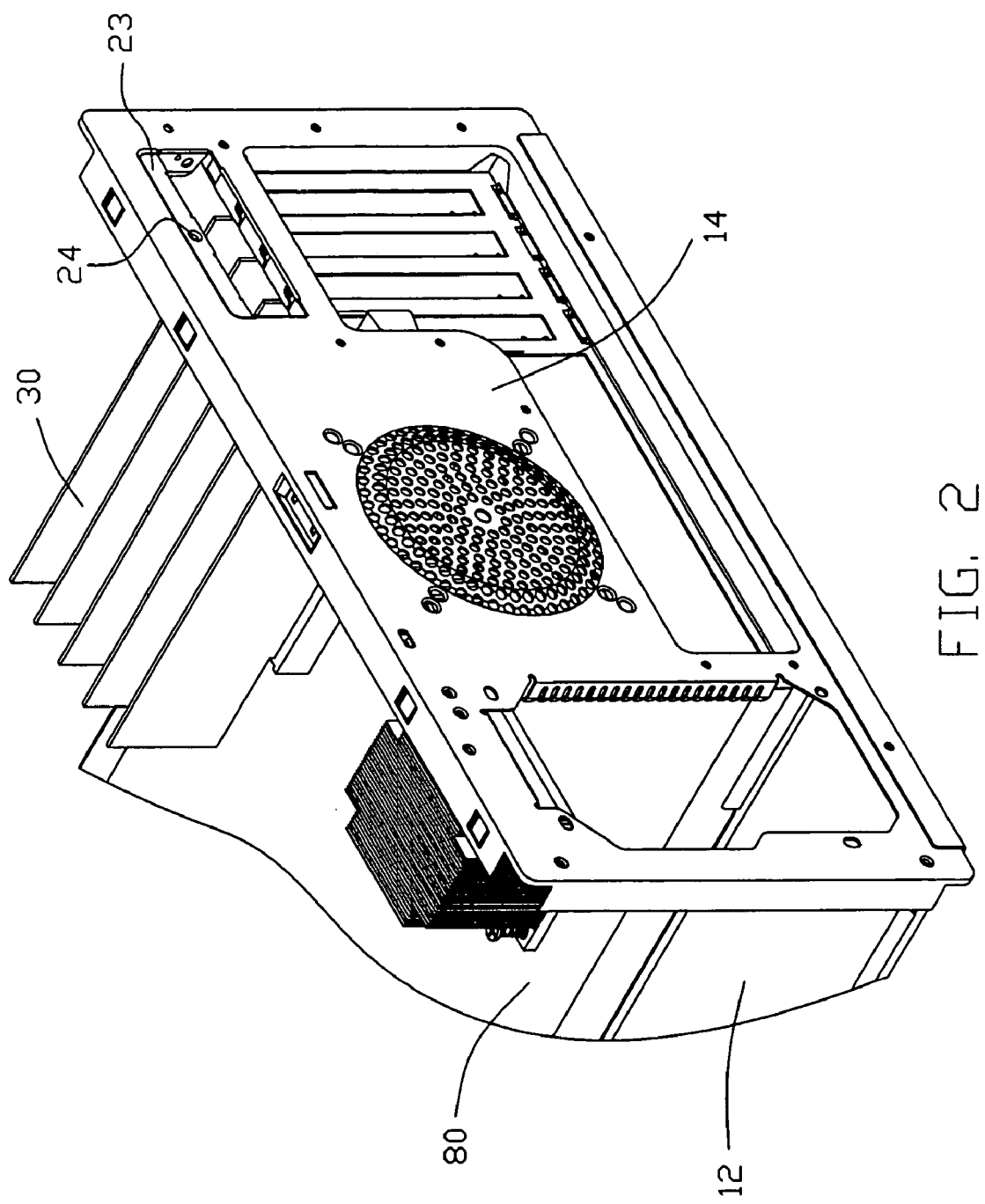
FIG. 2 is an assembled view of the chassis, the fixing member, the circuit board, the expansion cards and the cover plates of FIG. 1, but viewed from another aspect.

Referring to FIGS. 1 and 2, a mounting apparatus in accordance with the preferred embodiment of the present invention is used to fix a plurality of expansion cards 30 with cover plates 35 to an enclosure of an electronic device like a computer. The mounting apparatus comprises a chassis (not labeled) and a fixing member 40. Each cover plate 35 comprises a rectangular elongated portion 36 connected to the expansion card 30, and a bent portion 37 extending perpendicularly from one end of the elongated portion 36. A cutout 39 is defined in the bent portion 37.

The chassis comprises a bottom panel 12 supporting a circuit board 80 and a rear panel 14 extending upwardly from a rear side of the bottom panel 12. An opening 16 is defined in an upper portion of the rear panel 12. A pair of slices 18 extends from the rear panel 12 at both sides of the opening 16. A pivot hole 20 is defined in a lower portion of each of the slices 18. A positioning protrusion 22 protrudes inwardly from an upper portion of each of the slices 18. The rear panel 14 is stamped inwardly to form a recess 23 above the opening 16. A locking post (not labeled) defining a screw hole 24 therein protrudes inwardly from the recess 23. The rear panel 14 further comprises an L-shaped card cage 25 at a bottom portion under the opening 16. The card cage 25 comprises a base wall 26 and a bent wall 27 extending perpendicularly from the base wall 26. A plurality of expansion card slots 28 is defined in the base wall 26 parallel to each other, and further extends to the bent wall 27, having a similar profile with the cover plates 35. A plurality of positioning posts 29 is formed on the bent wall 27 corresponding to the cutouts 39 of the cover plates 35.

Figure 3:
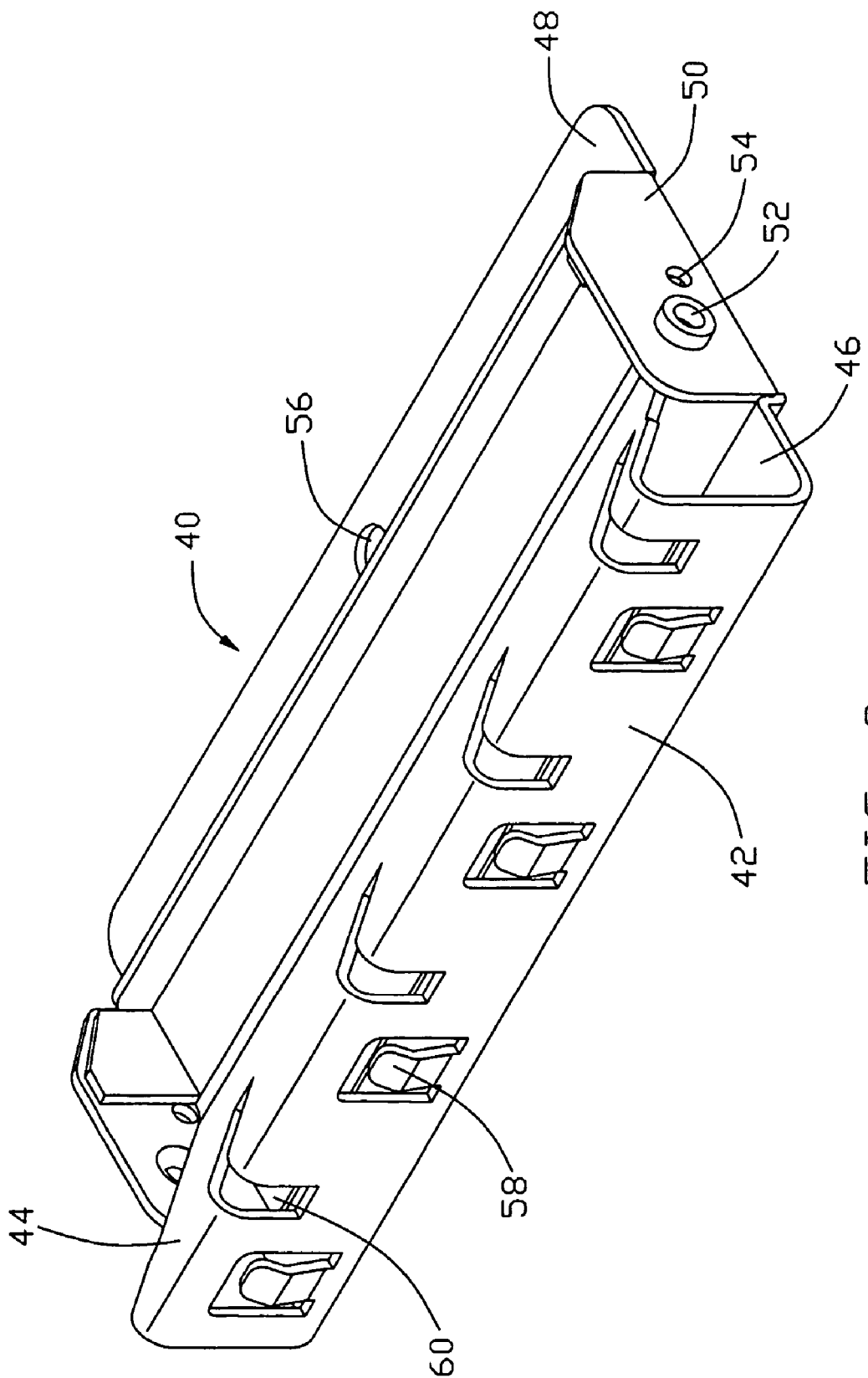
FIG. 3 is an isometric view of the fixing member of FIG. 1, but viewed from another aspect.

Referring also to FIG. 3, the fixing member 40 comprises a bottom wall 42, a rear wall 46 extending upwardly from a rear side of the bottom wall 42, and a slanting front wall 44 extending from a front side of the bottom wall 42 to being securely attached to a middle portion of the rear wall 46. An upper portion of the rear wall 46 forms a mounting portion 48. A locking hole 56 is defined in the mounting portion 48 corresponding to the screw hole 24 of the rear panel 14. Two tabs 50 extend forwardly from both sides of a middle portion of the rear wall 46. A pivot post 52 protrudes outward from a lower portion of each of the tabs 50. A positioning hole 54 is defined in an upper portion of each of the tabs 50. A plurality of through holes (not labeled) corresponding to the cover plates 35 is defined in the bottom wall 42. An elastic pressing tab 58 corresponding to the bent portion 37 of the cover plate 35 extends into each of the through holes from a rear side thereof. A plurality of avoiding openings 60 corresponding to the positioning posts 29 of the rear panel 14 is defined in the fixing member 40 from the bottom wall 42 to the front wall 44.

Figure 4:
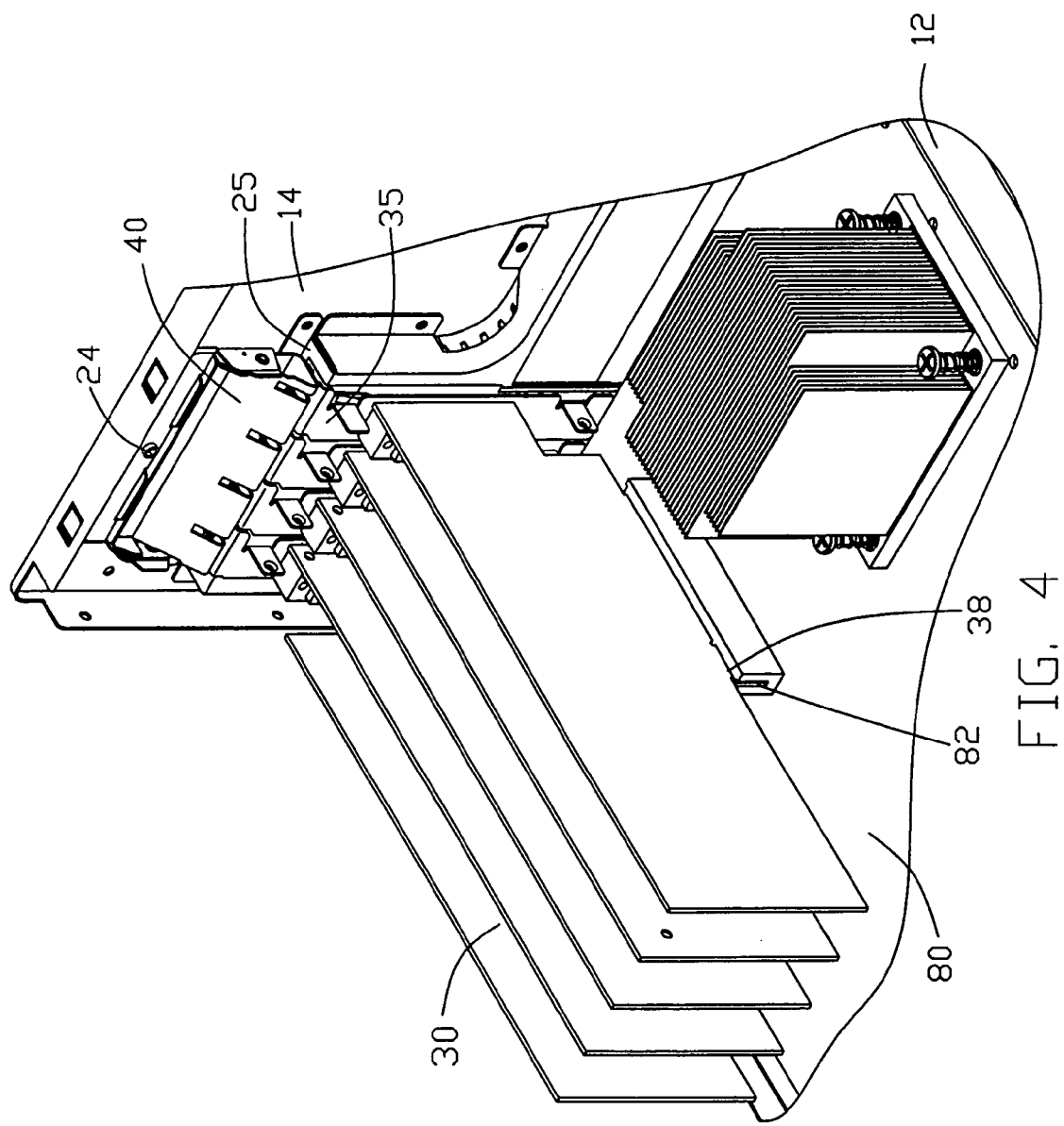
FIG. 4 is an assembled view of FIG. 1.

Referring also to FIG. 4, in assembling the fixing member 40 to the rear panel 14, the fixing member 40 is mounted to the rear panel 14 from an outer side through the opening 16. The pivot posts 52 of the fixing member 40 are received in respective pivot holes 20 of the rear panel 14. The fixing member 40 is pivotably mounted to the rear panel 14 by riveting the pivot posts 52, with the mounting portion 48 facing the recess 23 at an outer space.

Figure 5:
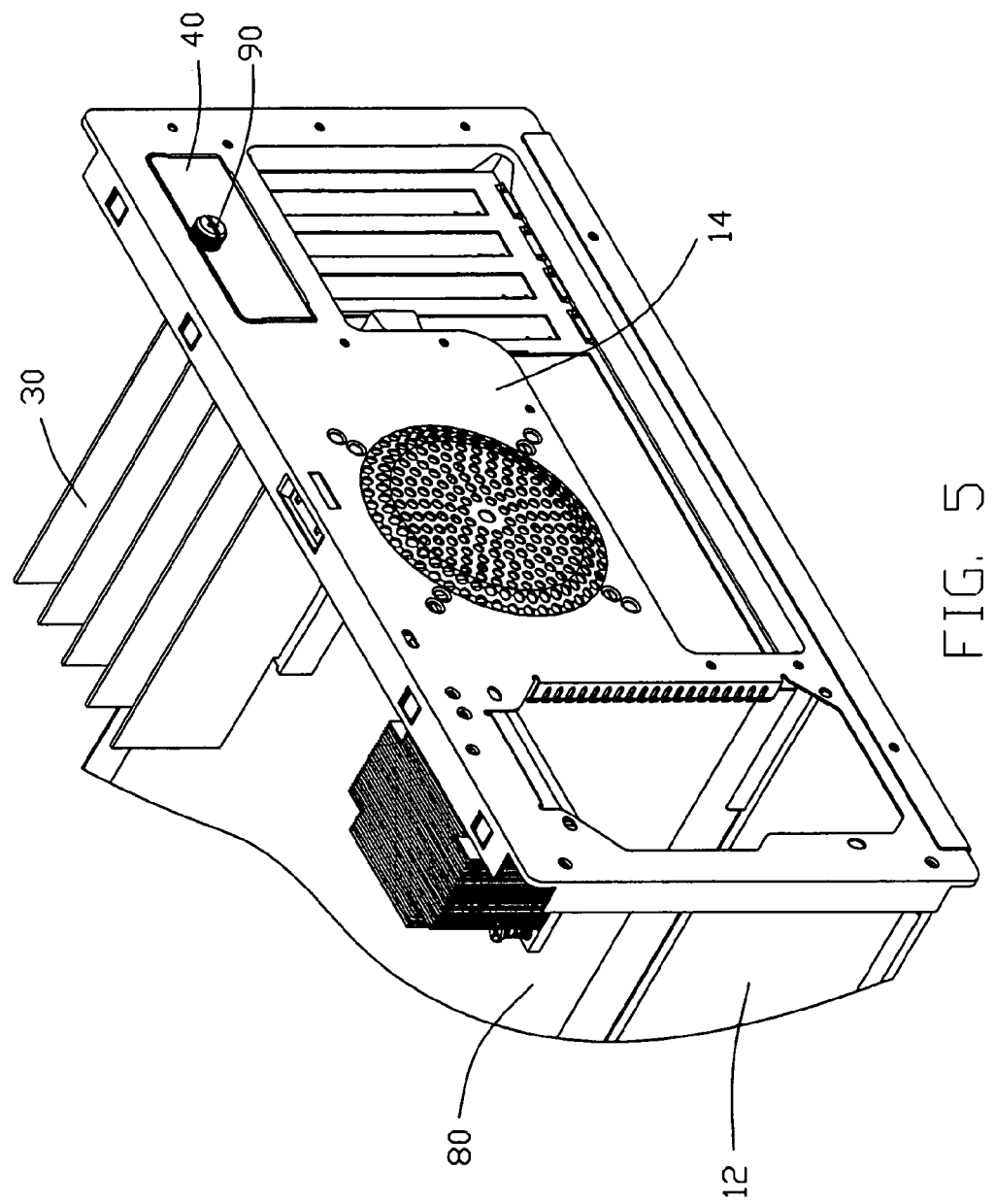
FIG. 5 is similar to FIG. 4, but viewed from another aspect.

Referring also to FIG. 5, in assembling the combined expansion cards 30 and cover plates 35 to the rear panel 14, the fixing member 40 is rotated outwardly. Connecting part 38 (see FIG. 1) of each of the expansion cards 30 is inserted into a respective expansion slot 82 (see FIGS. 1 and 4). Then the corresponding cover plate 35 is attached to the slot 28 of the card cage 25. The cutout 39 of each of the cover plates 35 receives the corresponding positioning post 29 of each of the bent walls 27. Push the mounting portion 48 of the fixing member 40 to rotate round the pivot posts 52 inwardly. The pressing tabs 58 of the fixing member 40 press respective bent portions 37 of the cover plates 35. The positioning posts 29 are received in respective avoiding openings 60. The positioning protrusions 22 are received in respective positioning holes 54. The expansion cards 30 are thus securely attached to the rear panel 14. For better securing the fixing member 40 to the rear panel 14, a screw 90 is inserted through the locking hole 56 of the fixing member 40 to be engaged with the screw hole 24 of the rear panel 14.

In disassembling the expansion cards 30 from the rear panel 14, the screw 90 is released from the rear panel 14 and the fixing member 40. Rotate the fixing member 40 round the pivot posts 52 outwardly till the positioning protrusions 22 are released from respective positioning poles 54. When the bent portions 37 of the cover plates 35 are released from the pressing tabs 58 of the fixing member 40, the expansion card 30 thus are removed from the rear panel 14.

It is to be understood, however, that even though numerous characteristics and advantages of the present invention have been set fourth in the foregoing description, together with details of the structure and function of the invention, the disclosure is illustrative only, and changes may be made in detail, especially in matters of shape, size, and arrangement of parts within the principles of the invention to full extent indicated by the broad general meaning of the terms in which the appended claims are expressed.

What is claimed is:

1. A mounting apparatus for mounting a plurality of expansion cards with cover plates to a computer enclosure, each of the cover plates having an elongated portion and a bent portion, the mounting apparatus comprising:
   a rear panel having a card cage, the card cage comprising a base wall to support the cover plate, and a bent wall, the rear panel defining an opening therein above the card cage, at least one slice extending from the rear panel at one side of the opening, a first positioning means being formed on said slice; and
   a fixing member pivotably mounted to the rear panel and rotated through the opening, the fixing member comprising a bottom wall, a rear wall extending upwardly from a rear side of the bottom wall, and at least one tab extending forwardly from one side of the rear wall, a second positioning means corresponding to the first positioning means formed on said tab, a plurality of elastic pressing means corresponding to the bent portions of the cover plates formed on the bottom wall;
   wherein in assembly, said first positioning means engages with said second positioning means, said pressing means press the bent portions, the expansion cards are secured to the rear panel; in disassembly, said first positioning means is released from said second positioning means, the fixing member is rotated rearward, the pressing means release the bent portions, the expansion cards are thus removed from the rear panel.

2. The mounting apparatus as described in claim 1, wherein a pair of said slices extends from the rear panel at both sides of the opening, said first positioning means comprises a positioning protrusion protrudes inwardly from an upper portion of each of the slices.

3. The mounting apparatus as described in claim 2, wherein a pair of said tabs extends forwardly from both sides of a middle portion of the rear wall, said second positioning means comprises a positioning hole defined in an upper portion of each of the tabs.

4. The mounting apparatus as described in claim 3, wherein a pivot hole is defined in a lower portion of each of the slices, a pivot post being received in the pivot hole protrudes from a lower portion of each of the tabs.

5. The mounting apparatus as described in claim 1, wherein the fixing member further comprises a slanting front wall extending from a front side of the bottom wall to be securely attached to a middle portion of the rear wall.

6. A mounting apparatus for mounting a plurality of expansion cards with cover plates to a computer enclosure, each of the cover plates having an elongated portion and a bent portion, the mounting apparatus comprising:
   a rear panel having a card cage, the card cage comprising a base wall to support the cover plate, and a bent wall, the rear panel defining an opening therein above the card cage, a screw hole being defined in the rear panel above the opening, wherein a pair of slices extends from the rear panel at both sides of the opening, a pivot hole is defined in a lower portion of each of the slices;
   a fixing member having two opposite ends pivotably secured to two opposite edges of the opening of the rear panel and rotated through the opening, the fixing member comprising a bottom wall, a rear wall extending upwardly from a rear side of the bottom wall, a plurality of elastic pressing means corresponding to the bent portions of the cover plates formed on the bottom wall, a locking hole corresponding to the screw hole of the rear panel being defined in an upper portion of the rear wall; and
   a screw;
   wherein in assembly, said pressing means press the bent portions, the fixing member is securely attached to the rear panel by the screw being inserted through the locking hole of the fixing member and engaged in the screw hole of the rear panel, the expansion cards are thus secured to the rear panel; in disassembly, the screw is removed from the rear panel and the fixing member, the fixing member is rotated rearward, the pressing means release the bent portions, the expansion cards are thus removed from the rear panel.

7. The mounting apparatus as described in claim 6, wherein a pair of tabs extends forwardly from a middle portion of both sides of the rear wall, a pivot post being received in the pivot hole protrudes from a lower portion of each of the tabs.

8. The mounting apparatus as described in claim 6, wherein the fixing member further comprises a slanting front wall extending from a front side of the bottom wall to be securely attached to a middle portion of the rear wall.

9. The mounting apparatus as described in claim 6, wherein the rear panel is stamped inwardly to form a recess above the opening, the screw hole of the rear panel is defined in the recess.

10. A mounting apparatus for mounting a plurality of expansion cards with cover plates to an enclosure of an electronic device, comprising:
   a rear panel of said enclosure having a card cage to supportively mount said cover plates thereto, and an opening defined next to said card cage and having a substantially same width as a totally occupied width of said cover plates of said plurality of extension cards upon said card cage; and
   a fixing member having two opposite ends pivotably secured to two opposite edges of the opening of said rear panel, and comprising a plurality of elastic pressing means corresponding to said cover plates of said plurality of extension cards and a rear wall fully coverable to said opening, said fixing member movable from a position where said cover plates are securely sandwiched between said plurality of pressing means and said card cage and said rear wall covers said opening, to another position where said cover plates are released from said plurality of pressing means and said opening is open due to moving away of said rear wall;
   wherein said plurality of pressing means is formed on a bottom wall of said fixing member integrally extending from said rear wall, said rear wall of said fixing member extends away from said two opposite ends of said fixing member at a first side of said rear panel of said enclosure and is partially movable across said rear panel from said first side thereof to a second side of said rear panel of said enclosure opposite to said first side thereof, said bottom wall of said fixing member extending away from said rear wall of said fixing member is movable exclusively at said second side.

11. The mounting apparatus as described in claim 10, wherein a front wall integrally extends from said bottom wall and slants toward said rear wall.

* * * * *